(12) United States Patent
Lowack et al.

(10) Patent No.: US 6,900,284 B2
(45) Date of Patent: May 31, 2005

(54) POLY-O-HYDROXYAMIDES, POLYBENZOXAZOLES, PROCESSES FOR PRODUCING POLY-O-HYDROXYAMIDES, PROCESSES FOR PRODUCING POLYBENZOXAZOLES, DIELECTRICS INCLUDING A POLYBENZOXAZOLE, ELECTRONIC COMPONENTS INCLUDING THE DIELECTRICS, AND PROCESSES FOR MANUFACTURING THE ELECTRONIC COMPONENTS

(75) Inventors: Klaus Lowack, Erlangen (DE); Anna Maltenberger, Leutenbach (DE); Recai Sezi, Röttenbach (DE); Andreas Walter, Egloffstein (DE)

(73) Assignee: Infineon Technologies AG, Munich (DE)

( * ) Notice: Subject to any disclaimer, the term of this patent is extended or adjusted under 35 U.S.C. 154(b) by 79 days.

(21) Appl. No.: 10/261,034

(22) Filed: Sep. 30, 2002

(65) Prior Publication Data

US 2003/0176623 A1 Sep. 18, 2003

(30) Foreign Application Priority Data

Sep. 28, 2001 (DE) .......................................... 101 47 927

(51) Int. Cl.$^7$ .......................... C08G 73/22; C08G 69/00
(52) U.S. Cl. ...................... 528/327; 528/183; 528/184; 528/272; 528/332; 528/347; 528/348; 528/363; 528/364; 528/367; 528/373; 525/420; 525/434
(58) Field of Search ........................................ 528/327

(56) References Cited

U.S. PATENT DOCUMENTS

| 5,696,218 | A | * | 12/1997 | Sezi et al. | 528/210 |
|---|---|---|---|---|---|
| 5,883,221 | A | * | 3/1999 | Sezi et al. | 528/327 |
| 6,120,970 | A | * | 9/2000 | Sezi et al. | 430/192 |
| 6,121,495 | A | | 9/2000 | Babb et al. | 568/14 |
| 6,153,350 | A | * | 11/2000 | Sezi et al. | 430/192 |
| 6,291,635 | B1 | * | 9/2001 | Maeda et al. | 528/401 |
| 6,384,182 | B2 | * | 5/2002 | Maeda et al. | 528/335 |

FOREIGN PATENT DOCUMENTS

| DE | 100 11 608 A1 | 10/2001 |
|---|---|---|
| WO | WO 97/10193 | 3/1997 |

* cited by examiner

*Primary Examiner*—P. Hampton Hightower
(74) *Attorney, Agent, or Firm*—Laurence A. Greenberg; Werner H. Stemer; Gregory L. Mayback (57) ABSTRACT

Poly-o-hydroxyamides are cyclicized to obtain polybenzoxazoles. The poly-o-hydroxyamides provide effective filling of trenches. In particular, the poly-o-hydroxyamides can fill trenches having a width of less than 100 nm and an aspect ratio of more than 4. Further, the polybenzoxazoles of the invention are very suitable for the damascene process. A dielectric can be made from the polybenzoxazole. In turn, semiconductor devices can include the dielectric. Processes for making the poly-o-hydroxyamides, polybenzoxazoles, and semiconductor devices are included.

4 Claims, 4 Drawing Sheets

POLY-O-HYDROXYAMIDES, POLYBENZOXAZOLES, PROCESSES FOR PRODUCING POLY-O-HYDROXYAMIDES, PROCESSES FOR PRODUCING POLYBENZOXAZOLES, DIELECTRICS INCLUDING A POLYBENZOXAZOLE, ELECTRONIC COMPONENTS INCLUDING THE DIELECTRICS, AND PROCESSES FOR MANUFACTURING THE ELECTRONIC COMPONENTS

BACKGROUND OF THE INVENTION

Field of the Invention

The invention relates to poly-o-hydroxyamides, polybenzoxazoles, processes for producing poly-o-hydroxyamides, processes for producing polybenzoxazoles, dielectrics including a polybenzoxazole, electronic components including the dielectric, and processes for manufacturing the electronic components.

In order to prevent signal crosstalk due to capacitive coupling, adjacent conductor tracks in microchips are insulated from one another by a dielectric disposed between the tracks. Compounds suitable for use as dielectrics are required to meet a variety of requirements. The signal transit time in microchips depends not only on the material from which the conductor track is made but also on the dielectric disposed between the tracks. The lower the dielectric constant of the dielectric, the shorter the signal transit time. The dielectrics used to date, based on silicon dioxide, possess a dielectric constant of approximately four (~4). These materials are gradually being replaced by organic dielectrics, whose dielectric constant is much lower. The dielectric constant of these materials is usually below three (<3).

The increasing density of integration of the components on the microchip is being accompanied by a decrease in the width of the conductor tracks or of the trenches between the conductor tracks, while the aspect ratio, in other words the ratio of height to width for each feature, is increasing. In the case of the memory chips that are being developed at present, the width of the trenches is in the order of magnitude of from 100 nm to 400 nm, while the aspect ratios may be well above 4. In order to be able to fill these trenches, the materials used as dielectrics must therefore exhibit not only a good insulating effect but also very good filling properties. In order to prevent detachment of the dielectric from the trenches during the production of the microchip, an operation where high thermal and mechanical loads may occur, the dielectric must also adhere very effectively both to the trench sidewalls and to the substrate. Where dielectrics based on organic polymers are used, they are also required to exhibit a high level of temperature stability, in order to prevent the polymers decomposing during microchip fabrication. Moreover, the dielectrics are required to be stable toward process chemicals, such as solvents, strippers, bases, acids, and aggressive gases. Further requirements are good solubility and sufficient stability of the precursors on storage.

In the microchips that are common at present, the conductor tracks are composed preferably of aluminum, AlCu, or AlCuSi. As the density of integration of the memory chips increases, there is a transition from aluminum to copper as the conductor track material, on account of the lower electrical resistance of the latter. Copper allows shorter signal transit times and hence a reduction in the cross section of the conductor track. In contrast to the techniques that have been customary to date, where the dielectric is introduced into the trenches between the conductor tracks, it is the dielectric which is structured (patterned) first in the copper damascene technique. The resultant trenches are first coated with a very thin barrier, formed from titanium, titanium nitride, tantalum, tantalum nitride, silicon carbide, silicon nitride, or silicon carbonitride. Thereafter the trenches are filled first with copper and then excess copper is abraded mechanically. Here too, it is important that the dielectric does not undergo detachment from the substrate during the operation of mechanical abrasion. Nor must the copper or the barrier detach from the dielectric in the course of abrading. The adjacent sidewalls of dielectric and barrier or copper track must therefore adhere very well to one another in order to be able to withstand the mechanical load of the abrasion operation.

International PCT Publication WO 97/10193, which corresponds to U.S. Pat. No. 6,121,495, describes polymers suitable as dielectrics for insulating conductor tracks in microchips. These polymers are obtained from aromatic compounds that carry an ethynyl substituent. The adhesion of these compounds to materials such as those used in micro-electronics, however, is very mediocre. Moreover, metallic catalysts, such as palladium, for example, used in preparing these polymers cannot be removed without residue from the polymer, which is detrimental to their use in microelectronics. These polymers may be doped with metals. Therefore, when the polymers come into contact with metals within the microchip, the metals diffuse into the polymer to impair its electrical insulator properties. These polymers are applied to the substrate preferably in the form of oligomeric precursors and only then are polymerized. As a result, curing of the material may be accompanied by stresses in the microchip, leading to the formation of defects.

Polybenzoxazoles (PBOs) are polymers of very high thermal stability. These substances are already used for producing protective and insulating coats. Polybenzoxazoles can be prepared by cyclization from poly-o-hydroxyamides. The poly-o-hydroxyamides exhibit good solubility in organic solvents and also good film-forming properties. They are easy to apply to electronic components by spin coating. Following a temperature treatment, during which the poly-o-hydroxyamide cyclizes to the polybenzoxazole, a polymer having the desired properties is obtained. Polybenzoxazoles can also be processed directly in their cyclized form. In general, however, there are difficulties with the solubility of the polymer. Building blocks for poly-o-hydroxyamides are described, for example, in German Patent Application No. DE 100 11 608, which corresponds to U.S. patent application Publication No. 2002010370A1.

The mechanism that takes place during the cyclization of poly-o-hydroxyamides to polybenzoxazoles is depicted schematically below:

On heating, the o-hydroxyamide cyclizes to the oxazole, accompanied by release of water.

SUMMARY OF THE INVENTION

It is accordingly an object of the invention to provide poly-o-hydroxyamides, polybenzoxazoles, processes for producing poly-o-hydroxyamides, processes for producing polybenzoxazoles, dielectrics including a polybenzoxazole, electronic components including the dielectric, and processes for manufacturing the electronic component that overcome the hereinafore-mentioned disadvantages of the heretofore-known devices and processes of this general type. The polymers are easy to apply to electronic components. Furhtermore, following cyclization, the polymers exhibit not only a good electrical insulating effect and adequate temperature stability but also very good adhesion and filling properties.

This object is achieved with a poly-o-hydroxyamide of the Formula I:

FORMULA I where

Q is

Z is

A is

T is

X is a substituent selected from the following group:

-continued $R^1$ is substituent selected from the following group:

$R^2$ is a substituent selected from the group including a hydrogen atom, a trifluoromethyl radical, an alkyl radical having from 1 to 10 carbon atoms,

$R^3$ is an alkyl substituent having from 1 to 10 carbon atoms or an aryl radical having from 5 to 22 carbon atoms;

$R^4$ is a divalent substituent selected from the following group:

$Y^1$ and $Y^2$ each independently of one another are a radical selected from the following group:

where if $R^4$=—$CH_2$— x=0–10, and additionally n is a number between 1 and 100;

m is a number between 1 and 100;

p is a number between 0 and 50;

x is a number between 1 and 10;

y is a number between 1 and 10; and w is a number between 0 and 10.

The preparation of the poly-o-hydroxyamides of the Formula I does not produce polymers having a uniform molecular weight, rather a molecular weight distribution is observed. The indices n, m, and p are therefore a function of the maximum of the molecular weight distribution. The molecular weight distribution can be determined by customary methods, such as by gel permeation methods. For individual polymer molecules, the indices correspond in each case to whole numbers.

Preferably, $R^1$ is a trifluoromethyl radical.

The polymers of the invention possess very good solubility in numerous organic solvents. Examples of solvents that can be used include acetone, cyclo-hexanone, diethylene glycol, monoethyl or diethyl ether, N-methylpyrrolidone, γ-butyrolactone, ethyl lactate, methoxypropyl acetate, tetrahydrofuran, ethyl acetate, and mixtures of those solvents. The solutions can be applied with good results by spin coating, spraying, or dipping methods to surfaces of electronic components, where they exhibit very good film quality. Even trenches with a width of less than 100 nm and an aspect ratio of more than 4 can be filled without difficulty. The poly-o-hydroxyamides of the invention can be cyclized by heating at temperatures from 200 to 500° C. During this cyclization, in spite of the elimination of water, no defects such as bubbles or cracks occur in the filled trenches. The polybenzoxazoles obtained in the cyclization have a dielectric constant k of less than 2.6. The temperature stability of the polymers is high, as is their stability toward process chemicals, such as solvents, strippers, bases, acids, and aggressive gases.

Therefore, the invention additionally provides polybenzoxazoles of the Formula II:

FORMULA II where

Q' is

Z' is

A' is

T is

X' is

-continued and $R^1$, $R^2$, $R^3$, $R^4$, n, m, p, x, y and w are as defined above.

Preferably, $R^1$ is a trifluoromethyl radical.

The poly-o-hydroxyamides of the Formula I can be prepared by polycondensation of di-o-hydroxyamines with appropriate dicarboxylic acids. The invention therefore further provides a process for preparing poly-o-hydroxyamides of the Formula I by reacting a bisamino-phenol of the Formula III

FORMULA III where $R^1$ and $R^2$ are as defined above, with an activated dicarboxylic acid derivative of the Formula IV

FORMULA IV where L stands for an activating group and $Y^1$ is as defined above.

As the activating group L it is possible to use customary activated groups. For example, acid chlorides can be used. In addition, the reaction of the dicarboxylic acid with a bis-o-aminophenol may take place in the presence of a carboxylic-acid-activating compound, such as carbonyldiimidazole, dicyclohexyl-carbodiimide, or hydroxybenzotriazole, for example. Suitable per se in principle are all reagents that bind the water formed during the reaction.

In addition to the dicarboxylic acid depicted by the Formula IV, further dicarboxylic acids may be used as comonomers. In accordance with one preferred embodiment, the reaction may be conducted in the presence of an activated dicarboxylic acid derivative of the Formula V Formula V where U stands for an activating group and $Y^2$ is as defined above. Examples of suitable activating groups are the groups indicated above for L. The polymerization may be conducted in such a way that the compounds of the Formulae III, IV, and V are present simultaneously in the reaction mixture. In that case, the distribution of the repeating units derived from the dicarboxylic acids of the Formulae IV and V in the polymer is random. Alternatively, the polymerization may be conducted in the form of a block polymerization. For that purpose, a polymer is first prepared from the compounds of the Formulae III and IV. Following preparation of the polymer, the dicarboxylic acid derivative of the Formula V and, where appropriate, further bis-o-aminophenol of the Formula III are added. After the end of the polymerization, end groups X are attached to the ends of the polymer, on the free amino groups. The reagents are derived from the structures of the group X shown above, in each case using an activated carboxylic acid derivative: an acid chloride, for example.

The polymerization is preferably conducted in the presence of a base, which neutralizes acids that are liberated.

Examples of suitable bases include pyridine, triethylamine, diazabicyclooctane, and polyvinylpyridine. In principle, however, it is also possible to use other bases to neutralize the acid. Particular preference is given to bases that are readily soluble in solvents that are used for the synthesis, e.g., N-methyl-pyrrolidone, and in water or water/alcohol mixtures, or those which are completely insoluble in the solvent, such as crosslinked polyvinylpyridine, for example.

Suitable solvents for the polymer synthesis include, for example, γ-butyrolactone, tetrahydrofuran, N-methylpyrrolidone, and dimethylacetamide. However, it is possible per se to use any solvent in which the starting components are readily soluble.

As already described above, the poly-o-hydroxyamides of the Formula I can be cyclized by heating. The invention therefore also provides a process for preparing polybenzoxazoles of the Formula II by heating poly-o-hydroxyamides of the Formula I. The cyclization is conducted preferably at temperatures from 200 to 500° C.

The polybenzoxazole of the invention possesses a low dielectric constant of $k \leq 2.6$. It adheres very well to the surfaces relevant for chip technology, such as silicon, silicon carbide, silicon carbonitride, silicon nitride, silicon oxide, titanium, tantalum, titanium nitride, tantalum nitride or silicon oxynitride. The invention accordingly also provides an electronic component that includes the above-described poly-benzoxazole of the Formula II as dielectric.

The dielectrics of the invention are outstandingly suitable for the copper damascene technique. The abrasion process is not accompanied by any deleterious effects such as detachments, cracking, or bubbling. The invention therefore also provides a process for producing an electronic component, which involves preparing a solution of a poly-o-hydroxyamide of the Formula I in a solvent. The solution is applied to a substrate and the solvent is evaporated to leave a film. The film is heated in order to cyclize the poly-o-hydroxyamide. The film is then patterned to give a resist pattern which contains trenches. A conducting material is deposited on the resist pattern so that the trenches are filled with the conducting material. Finally, excess conducting material is removed.

The film can be patterned using, for example, lithographic techniques, in which case an etch-resistant mask is produced on the film. The pattern of the mask is subsequently transferred by etching into the film of the polybenzoxazole of the invention. The conducting material used is preferably copper. It is possible to provide a barrier between dielectric and conducting material. Examples of suitable barrier materials are the materials already mentioned above. Excess conducting material is removed, for example, by chemical-mechanical polishing.

The invention further provides a process for producing an electronic component, which involves first preparing a solution of an above-described poly-o-hydroxy-amide in a solvent. The solution is subsequently applied to a substrate whose surface already features metallic structures between which there are trenches. Structures of this kind are, for example, conductor tracks. The solvent is evaporated so that the trenches are filled with the poly-o-hydroxy-amide. Finally, the substrate is heated in order to cyclize the poly-o-hydroxy-amide to the polybenzoxazole.

The adhesion of the polyhydroxyamides to surfaces encountered in microelectronics, such as silicon, silicon oxide, silicon nitride, tantalum nitride, glass, or quartz, for example, can be enhanced by adding adhesion promoters.

Examples of adhesion promoters which can be used include the following compounds:

Other features that are considered as characteristic for the invention are set forth in the appended claims.

Although the invention is illustrated and described herein as embodied in poly-o-hydroxyamides, polybenzoxazoles, processes for producing poly-o-hydroxyamides, processes for producing polybenzoxazoles, dielectrics including a polybenzoxazole, electronic components including the dielectric, and processes for manufacturing the electronic component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

The polyhydroxyamides of the invention are prepared using the following compounds:

Bisaminophenols:

bisaminophenol 1: 2,2-bis(3-amino-4-hydroxyphenyl) hexafluoropropane

Dicarbonyl Chlorides:

dicarbonyl chloride 1: 2,2-bis(4-chlorocarbonylphenyl) hexafluoropropane dicarbonyl chloride 2: diphenyl ether 4,4'-dicarbonyl chloride dicarbonyl chloride 3: 5-norbornene-2,3-dicarbonyl dichloride dicarbonyl chloride 4: 5-phenylethynylisophthaloyl chloride dicarbonyl chloride 5: 5-allyloxyisophthaloyl dichloride dicarbonyl chloride 6: 2,6-naphthalenedicarbonyl dichloride dicarbonyl chloride 7: 4,4'-biphenyldicarbonyl dichloride dicarbonyl chloride 8: terephthaloyl dichloride Reagents for Terminal Groups (Endcaps):

Endcap 1: methacryloyl chloride

Endcap 2: 5-norbornene-2-carbonyl chloride

Endcap 3: 5-norbornene-2,3-dicarboxylic anhydride

EXAMPLE 1

Polyhydroxyamide 1

190.44 g (0.52 mol) of bisaminophenol 1 are dissolved in 720 ml of distilled N-methylpyrrolidone (NMP). Added dropwise to this solution at 10° C. and with stirring is a solution of 169.4 g (0.395 mol) of dicarbonyl chloride 1 and 29.16 g (0.0988 mol) of dicarbonyl chloride 2 in 960 ml of distilled γ-butyrolactone (γ-BL). The mixture is stirred at 10° C. for 1 hour and then at 20° C. for 1 hour. After the reaction mixture has again cooled to 10° C., 9.36 g (0.052 mol) of endcap 3 in solution in 120 ml of distilled γ-BL are added dropwise to it, and the resulting mixture is stirred at 10° C. for 1 hour and then at 20° C. for 1 hour. After cooling to 10° C., the reaction mixture is admixed with 91.2 ml (1.0868 mol) of pyridine in solution in 100 ml of distilled γ-BL, heated to room temperature, and stirred for 2 hours.

The polymer is isolated by filtering the reaction mixture and introducing the filtrate dropwise with stirring into a mixture of 2 l of deionized (DI) water and 400 ml of methanol, adding a further 5 l of DI water during the dropwise introduction. The precipitated polymer is filtered off with suction and washed with 3 l of cold DI water. Following its isolation by suction filtration, the polymer is stirred twice at room temperature each time into 3 l of a 3% strength ammonia solution for 1 hour, after which it is filtered off with suction. The polymer is washed to neutrality with DI water, isolated by filtration, and dried at 50° C./10 mbar for 72 hours.

The polyhydroxyamide prepared in this way is readily soluble in solvents such as NMP, γ-BL, tetrahydrofuran, cyclohexanone, cyclopentanone, and diethylene glycol monomethyl ether.

EXAMPLE 2

Polyhydroxyamide 2

25 g (0.06826 mol) of bisaminophenol 1 are dissolved in 90 ml of distilled NMP. Added dropwise to this solution at 10° C. and with stirring is a solution of 25.05 g (0.05836 mol) of dicarbonyl chloride 1 and 1.42 g (0.006485 mol) of dicarbonyl chloride 3 in 150 ml of distilled γ-BL. The mixture is stirred at 10° C. for 1 hour and then at 20° C. for 1 hour. After the reaction mixture has again cooled to 10° C., 0.71 g (0.006826 mol) of endcap 1 in solution in 50 ml of distilled γ-BL are added dropwise to it, and the resulting mixture is stirred at 10° C. for 1 hour and then at 20° C. for 1 hour. After cooling to 10° C., the reaction mixture is admixed with 11.5 ml (0.1427 mol) of pyridine in solution in 50 ml of distilled γ-BL, heated to room temperature, and stirred for 2 hours.

Polyhydroxyamide 2 was isolated and worked up as in example 1.

EXAMPLE 3

Polyhydroxyamide 3

25 g (0.06826 mol) of bisaminophenol 1 are dissolved in 90 ml of distilled NMP. Added dropwise to this solution at 10° C. and with stirring is a solution of 16.7 g (0.0389 mol) of dicarbonyl chloride 1 and 7.83 g (0.02594 mol) of dicarbonyl chloride 4 in 150 ml of distilled γ-BL. The mixture is stirred at 10° C. for 1 hour and then at 20° C. for 1 hour. After the reaction mixture has again cooled to 10° C., 1.12 g (0.006826 mol) of endcap 3 in solution in 50 ml of distilled γ-BL are added dropwise to it, and the resulting mixture is stirred at 10° C. for 1 hour and then at 20° C. for 1 hour. After cooling to 10° C., the reaction mixture is admixed with 11.5 ml (0.1427 mol) of pyridine in solution in 50 ml of distilled γ-BL, heated to room temperature, and stirred for 2 hours.

Polyhydroxyamide 3 was isolated and worked up as in example 1.

EXAMPLE 4

Polyhydroxyamide 4

25 g (0.06826 mol) of bisaminophenol 1 are dissolved in 90 ml of distilled NMP. Added dropwise to this solution at 10° C. and with stirring is a solution of 16.7 g (0.0389 mol) of dicarbonyl chloride 1 and 6.69 g (0.02594 mol) of dicarbonyl chloride 5 in 150 ml of distilled γ-BL. The mixture is stirred at 10° C. for 1 hour and then at 20° C. for 1 hour. After the reaction mixture has again cooled to 10° C., 1.06 g (0.006826 mol) of endcap 2 in solution in 50 ml of distilled γ-BL are added dropwise to it, and the resulting mixture is stirred at 10° C. for 1 hour and then at 20° C. for 1 hour. After cooling to 10° C., the reaction mixture is admixed with 11.5 ml (0.1427 mol) of pyridine in solution in 50 ml of distilled γ-BL, heated to room temperature, and stirred for 2 hours.

Polyhydroxyamide 4 was isolated and worked up as in example 1.

EXAMPLE 5

Polyhydroxyamide 5

25 g (0.06826 mol) of bisaminophenol 1 are dissolved in 90 ml of distilled NMP. Added dropwise to this solution at 10° C. and with stirring is a solution of 16.7 g (0.0389 mol) of dicarbonyl chloride 1 in 100 ml of distilled γ-BL. The mixture is stirred at 10° C. for 1 hour and then at 20° C. for 1 hour. The mixture is cooled to 10° C. and 6.69 g (0.02594 mol) of dicarbonyl chloride 5 in solution in 50 ml of distilled γ-BL are added dropwise. The mixture is stirred at 10° C. for 1 hour and then at 20° C. for 1 hour. After the reaction mixture has again cooled to 10° C., 1.12 g (0.006826 mol) of endcap 3 in solution in 50 ml of distilled γ-BL are added dropwise to it, and the resulting mixture is stirred at 10° C. for 1 hour and then at 20° C. for 1 hour. After cooling to 10° C., the reaction mixture is admixed with 11.5 ml (0.1427 mol) of pyridine in solution in 50 ml of distilled γ-BL, heated to room temperature, and stirred for 2 hours.

Polyhydroxyamide 5 was isolated and worked up as in example 1.

EXAMPLE 6

Polyhydroxyamide 6

25 g (0.06826 mol) of bisaminophenol 1 are dissolved in 90 ml of distilled NMP. Added dropwise to this solution at 10° C. and with stirring is a solution of 16.7 g (0.0389 mol) of dicarbonyl chloride 1 in 100 ml of distilled γ-BL. The mixture is stirred at 10° C. for 1 hour and then at 20° C. for 1 hour. The mixture is cooled to 10° C. and 6.56 g (0.02594 mol) of dicarbonyl chloride 6 in solution in 50 ml of distilled γ-BL are added dropwise. The mixture is stirred at 10° C. for 1 hour and then at 20° C. for 1 hour. After the reaction mixture has again cooled to 10° C., 1.12 g (0.006826 mol) of endcap 3 in solution in 50 ml of distilled γ-BL are added dropwise to it, and the resulting mixture is stirred at 10° C. for 1 hour and then at 20° C. for 1 hour. After cooling to 10° C., the reaction mixture is admixed with 11.5 ml (0.1427 mol) of pyridine in solution in 50 ml of distilled γ-BL, heated to room temperature, and stirred for 2 hours.

Polyhydroxyamide 6 was isolated and worked up as in example 1.

EXAMPLE 7

Polyhydroxyamide 7

25 g (0.06826 mol) of bisaminophenol 1 are dissolved in 90 ml of distilled NMP. Added dropwise to this solution at 10° C. and with stirring is a solution of 16.7 g (0.0389 mol) of dicarbonyl chloride 1 in 100 ml of distilled γ-BL. The mixture is stirred at 10° C. for 1 hour and then at 20° C. for 1 hour. The mixture is cooled to 10° C. and 7.24 g (0.02594 mol) of dicarbonyl chloride 7 in solution in 50 ml of distilled γ-BL are added dropwise. The mixture is stirred at 10° C. for 1 hour and then at 20° C. for 1 hour. After the reaction mixture has again cooled to 10° C., 1.12 g (0.006826 mol) of endcap 3 in solution in 50 ml of distilled γ-BL are added dropwise to it, and the resulting mixture is stirred at 10° C. for 1 hour and then at 20° C. for 1 hour. After cooling to 10° C., the reaction mixture is admixed with 11.5 ml (0.1427 mol) of pyridine in solution in 50 ml of distilled γ-BL, heated to room temperature, and stirred for 2 hours.

Polyhydroxyamide 7 was isolated and worked up as in example 1.

EXAMPLE 8

Polyhydroxyamide 8

25 g (0.06826 mol) of bisaminophenol 1 are dissolved in 90 ml of distilled NMP. Added dropwise to this solution at 10° C. and with stirring is a solution of 16.7 g (0.0389 mol) of dicarbonyl chloride 1 in 100 ml of distilled γ-BL. The mixture is stirred at 10° C. for 1 hour and then at 20° C. for 1 hour. The mixture is cooled to 10° C. and 5.266 g (0.02594 mol) of dicarbonyl chloride 8 in solution in 50 ml of distilled γ-BL are added dropwise. The mixture is stirred at 10° C. for 1 hour and then at 20° C. for 1 hour. After the reaction mixture has again cooled to 10° C., 1.12 g (0.006826 mol) of endcap 3 in solution in 50 ml of distilled γ-BL are added dropwise to it, and the resulting mixture is stirred at 10° C. for 1 hour and then at 20° C. for 1 hour. After cooling to 10° C., the reaction mixture is admixed with 11.5 ml (0.1427 mol) of pyridine in solution in 50 ml of distilled γ-BL, heated to room temperature, and stirred for 2 hours.

Polyhydroxyamide 8 was isolated and worked up as in example 1.

EXAMPLE 9

Polyhydroxyamide 9

25 g (0.06826 mol) of bisaminophenol 1 are dissolved in 90 ml of distilled NMP. Added dropwise to this solution at 10° C. and with stirring is a solution of 22.26 g (0.05187 mol) of dicarbonyl chloride 1, 1.91 g (0.006484 mol) of dicarbonyl chloride 2 and 1.97 g (0.006484 mol) of dicarbonyl chloride 4 in 150 ml of distilled γ-BL. The mixture is stirred at 10° C. for 1 hour and then at 20° C. for 1 hour. After the reaction mixture has again cooled to 10° C., 1.12 g (0.006826 mol) of endcap 3 in solution in 50 ml of distilled γ-BL are added dropwise to it, and the resulting mixture is stirred at 10° C. for 1 hour and then at 20° C. for 1 hour. After cooling to 10° C., the reaction mixture is admixed with 11.5 ml (0.1427 mol) of pyridine in solution in 50 ml of distilled γ-BL, heated to room temperature, and stirred for 2 hours.

Polyhydroxyamide 9 was isolated and worked up as in example 1.

EXAMPLE 10

Polyhydroxyamide 10

25 g (0.06826 mol) of bisaminophenol 1 are dissolved in 90 ml of distilled NMP. Added dropwise to this solution at 10° C. and with stirring is a solution of 22.26 g (0.05187 mol) of dicarbonyl chloride 1 and 1.91 g (0.006484 mol) of dicarbonyl chloride 2 in 120 ml of distilled γ-BL. The mixture is stirred at 10° C. for 1 hour and then at 20° C. for 1 hour. The mixture is cooled to 10° C. and 1.67 g (0.006484 mol) of dicarbonyl chloride 5 in solution in 50 ml of distilled γ-BL are added dropwise. The mixture is stirred at 10° C. for 1 hour and then at 20° C. for 1 hour. After the reaction mixture has again cooled to 10° C., 1.12 g (0.006826 mol) of endcap 3 in solution in 50 ml of distilled γ-BL are added dropwise to it, and the resulting mixture is stirred at 10° C. for 1 hour and then at 20° C. for 1 hour. After cooling to 10° C., the reaction mixture is admixed with 11.5 ml (0.1427 mol) of pyridine in solution in 50 ml of distilled γ-BL, heated to room temperature, and stirred for 2 hours.

Polyhydroxyamide 10 was isolated and worked up as in example 1.

EXAMPLE 11

Determination of the Thermal Stabilities

All of the polyhydroxyamides prepared exhibit thermal stabilities of >500° C. according to TGA analyses (instrument: STA 1500 from Rheometric Scientific, heating rate: 5 K/min, inert gas: argon). The isothermal mass loss per hour (at 400° C.) is <0.5%.

Accordingly, the polyhydroxyamides prepared meet the requirements for the applications indicated at the outset.

EXAMPLE 12

Preparation of Polymer Solutions 30 g of the polyhydroxyamides prepared in examples 1 to 10 are dissolved in 70 g of distilled NMP (VLSI-Selectipur®) or distilled γ-BL (VLSI-Selectipur®). Dissolving takes place appropriately on a shaker apparatus at room temperature. The solution is subse-quently subjected to pressure filtration through a 0.2 µm filter into a cleaned, particle-free glass sample vessel. The viscosity of the polymer solution can be altered by varying the mass of polyhydroxyamide dissolved.

EXAMPLE 13

Improvement of Adhesion by Adhesion Promoter Solutions 0.5 g of adhesion promoter (e.g., N-(2-aminoethyl)-3-aminopropylmethyldimethoxysilane) is dissolved at room temperature in 95 g of methanol, ethanol or isopropanol (such as that sold under the trademark VLSI-Selectipur®) and 5 g of DI water, the dissolution taking place into a cleaned, particle-free glass sample vessel. After standing at room temperature for 24 hours the adhesion promoter solution is ready to use. This solution can be used for a maximum of 3 weeks.

The adhesion promoter should produce a monomolecular film on the surface to be coated. The adhesion promoter can be applied appropriately by spin coating technology. For this purpose the adhesion promoter solution is applied via a 0.2 µm preliminary filter to the surface where bonding is to take place, followed by spinning at 5000 rpm for 30 seconds. This is followed in turn by a drying step at 100° C. for 60 seconds.

EXAMPLE 14

Application of a Polyhydroxyamide by Spin Coating and Cyclization to the Polybenzoxazole A processed silicon wafer with lines and trenches down to a minimum size of in each case approximately 150 nm is coated with the adhesion promoter as described in example 13. The filtered solution of the polyhydroxy-amide, synthesized in accordance with example 1, is then applied to the wafer using a syringe and is distributed uniformly using a spin coater. The rotational speed of the spin coater here is 3000 rpm. The polymer is subsequently heated on a hotplate at 120° C. for 2 minutes.

EXAMPLE 15

Determination of the Adhesion of the Polyhydroxyamides on a Titanium Nitride Layer A 4" silicon wafer is sputter coated with a titanium nitride layer 50 nm thick. The solution obtained in example 12 is applied to this wafer by spin coating: 500 rpm for 5 seconds and 3500 rpm for 25 seconds. After a short softbake at 120° C. for 1 minute on a hot-plate, 10 silicon chips measuring 4×4 mm², likewise surface coated with 50 nm titanium nitride by sputtering, are pressed onto the polyhydroxyamide film with a force of 2 N. This stack is then heat-treated in an oven at 400° C. for 1 hour under a nitrogen atmosphere. After cooling to room temperature, an adhesion test is performed using a shear tester, Dage series 400. The average of the force for polyhydroxyamide 1 that is needed to remove the chips by shearing is 16.37 N/mm².

EXAMPLE 16

Determination of the Adhesion of the Polyhydroxyamides on a Tantalum Nitride Layer The experiment is conducted in exactly the same way as described in example 15 with the difference that the surface of the wafer and of the chips did not include titanium nitride but rather tantalum nitride. The average of the force for polyhydroxyamide 1 that is needed to remove the chips by shearing is 16.41 N/mm².

EXAMPLE 17

Determination of the Adhesion of the Polyhydroxyamides on a Silicon Wafer

The experiment is conducted in exactly the same way as described in example 15 with the difference that the surface of the wafer and of the chips does not include tantalum nitride but instead silicon. The average of the force for polyhydroxyamide 1 that is needed to remove the Si chips by shearing is 17.04 N/mm².

EXAMPLE 18

Comparative Example, Adhesion

A polyhydroxyamide is prepared in analogy to example 1 of U.S. Pat. No. 5,077,378 and as described in example 12 a solution in NMP is prepared. The adhesion is measured in the same way as described in examples 15 and 17. The averages measured are as follows:
- titanium nitride surface: 14.71 N/mm²
- tantalum nitride surface: 15.69 N/mm²
- silicon surface: 15.21 N/mm²

EXAMPLE 19

Determination of the Chemical Stability

The polyhydroxyamide 1 is applied from 30% strength solution (solvent: NMP) by spin coating to a 4" silicon wafer, at 500 rpm for 5 seconds and at 3500 rpm for 25 seconds. Following a brief softbake on a hotplate at 120° C. for 1 minute, the wafer is heat-treated in an oven at 400° C. for 1 hour under a nitrogen atmosphere. After cooling to room temperature, the coated wafer is heated at 80° C. in NMP for 5 hours. Thereafter, the wafer is dried under reduced pressure at 200° C. for 60 minutes and the mass difference is determined. The mass decrease is 0.6%.

EXAMPLE 20

Determination of the Water Absorption

The polyhydroxyamide 1 is applied from 30% strength solution (solvent: NMP) by spin coating to a 4" silicon wafer of known mass, at 500 rpm for 5 seconds and at 3500 rpm for 25 seconds. Following a brief softbake on a hotplate at 120° C. for 1 minute, the wafer is heat-treated in an oven at 400° C. for 1 hour under a nitrogen atmosphere. A Delta Range AT261 analytical balance is used to determine the mass of polybenzoxazole.

The coated wafer is subsequently stored in water at 80° C. for 10 hours. After the water has been blown off, the weight is taken again. The mass difference is used to calculate the percentage water absorption relative to the mass of polybenzoxazole. Water absorption found: 0.5%.

EXAMPLE 21

Comparative Example, Water Absorption

For comparison, a 4" silicon wafer is coated as described in example 20 with a polyhydroxyamide prepared in analogy to example 1 of U.S. Pat. No. 5,077,378. A water absorption of 2.2% is measured.

EXAMPLE 22

Damascene Structure

Figure 1:
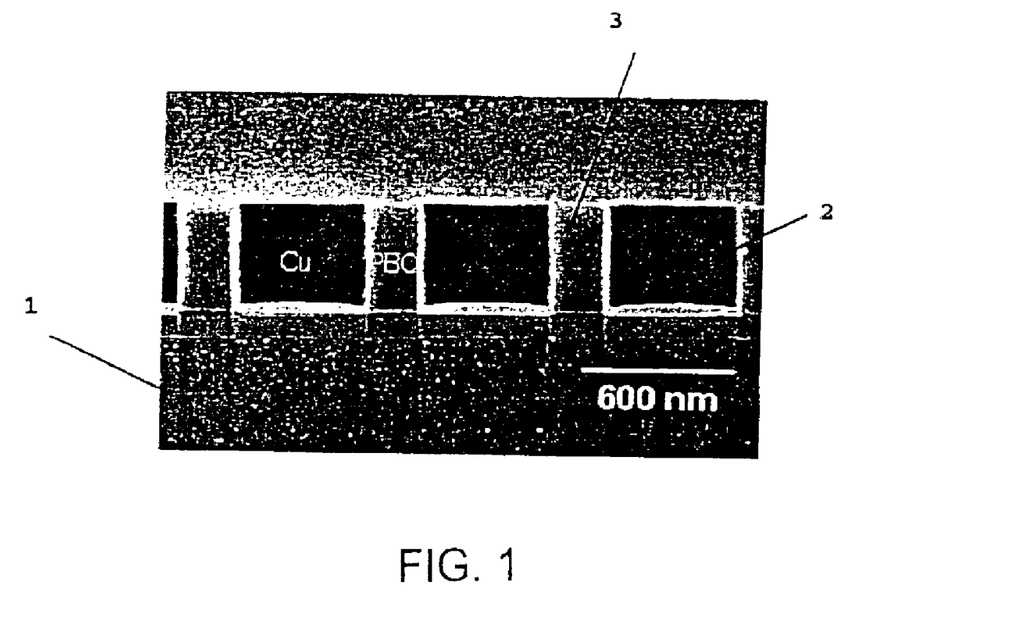
FIG. 1 is scanning electron micrograph showing a section through a wafer having cross-sectional faces of conductor tracks separated by a dielectric.

The polyhydroxyamide 1 is dissolved in γ-butyrolactone (20% strength solution) and the solution is subjected to pressure filtration via a membrane having 0.2 μm pores. The solution is applied to a silicon substrate by spin coating at 2500 rpm for 25 seconds and the layer is dried at 100° C. for 2 minutes and then at 140° C. for 2 minutes on a hotplate. The polyhydroxyamide is cured by heating the wafer at 400° C. under nitrogen for 1 hour, during which conversion takes place into the corresponding polybenzoxazole. Deposited atop this PBO layer, approximately 700 nm thick, in a PECVD unit (Novellus Concept 1) is an $SiO_2$ hardmask layer, which is 150 nm thick. This hardmask is structured (patterned) by using standard techniques of lithography and etching. Using the structured hardmask, the PBO layer is subsequently structured in the oxygen plasma in an RIE unit (Lam XL). Following deposition of a 10 nm TiN barrier in an AMAT Endura 5500 and application of a thin adhesion layer and initiating layer (500 nm Ti and 100 nm Cu), the structures are filled with copper by galvanization (Novellus SABRE System). The protruding copper is subsequently abraded back in a CMP operation. The resultant structures are homogeneous, free from bubbles and cracks, and do not exhibit any adhesion problems at all. FIG. 1 shows an electron micrograph of a section through the structure produced in the example. On the silicon substrate 1 there are copper conductor tracks 2. The interstice between adjacent conductor tracks 2 has been filled with polybenzoxazole 3 which has a uniform structure, i.e., is homogeneous and free from cracks and bubbles.

EXAMPLE 23

Damascene Structure 2

Example 22 is repeated but using polyhydroxyamide 2 instead of polyhydroxyamide 1. Here again, firmly adhering structures with no bubbles or cracks are obtained.

EXAMPLE 24

Damascene Structure 3

Example 22 is repeated but using polyhydroxyamide 3, in solution in NMP, instead of polyhydroxyamide 1. Here again, firmly adhering structures with no bubbles or cracks are obtained.

EXAMPLE 25

Example 22 is repeated but using polyhydroxyamide 5, in solution in NMP, instead of polyhydroxyamide 1. Here again, firmly adhering structures with no bubbles or cracks are obtained.

EXAMPLE 26

Damascene Structure 3

Example 22 is repeated but using the material from EP 0 264 678 B1, example 1, instead of polyhydroxyamide 1. Here, after such a sequence of operations, the structures show cracks and adhesion problems.

EXAMPLE 27

Determination of the Dielectric Constant

Figure 2A:
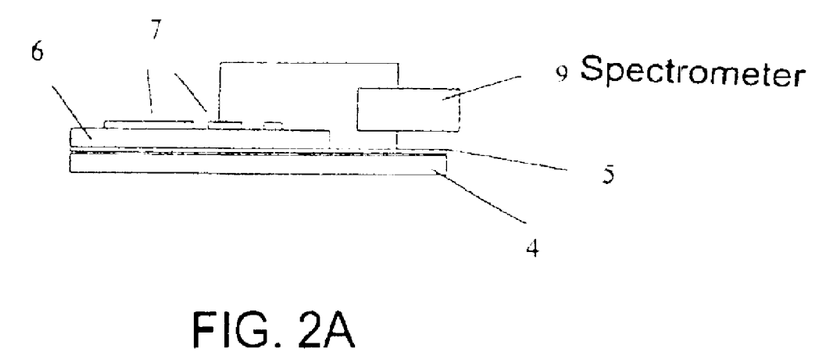
FIG. 2A is a partial diagrammatic and partial schematic view showing a scheme of the test setup for determining the dielectric constant.
Figure 2B:
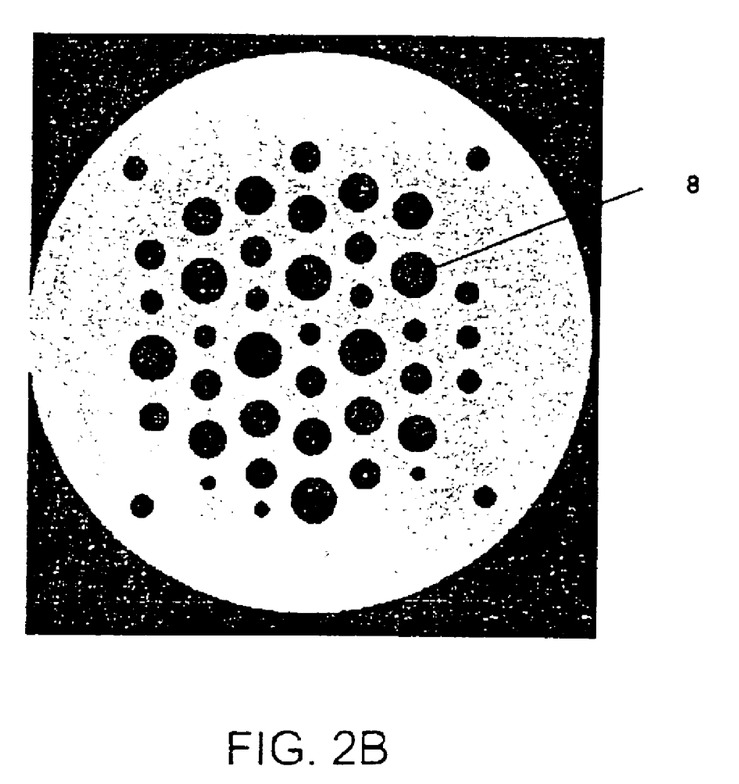
FIG. 2B is a photograph of the shadow mask used in the test setup.

The dielectric constant is measured in accordance with the scheme depicted in FIG. 2A. For this purpose polyhydroxyamide 2 is dissolved in NMP (25% strength solution) and the solution is subjected to pressure filtration via a membrane having 0.2 μm pores. This solution is applied by spin coating to a substrate 4 on which there is already a Ti layer 5 that is 600 nm thick. The layer 6 is heat-treated on a hotplate at 100° C. and at 140° C. for 2 minutes each and then at 400° C. for 1 hour under inert gas. Thereafter, Ti electrodes 7 are applied to this layer 6 by sputter coating, using a shadow mask that is depicted in FIG. 2B. The shadow mask contains apertures 8 which correspond to the position of the Ti electrodes 7. The dielectric constant is determined using an impedance spectrometer 9 and is 2.5 in the frequency range from 100 Hz to 1 MHz.

EXAMPLE 28

Comparative Example, Dielectric Constant

Example 27 is repeated but with the experiment being carried out with a polyhydroxyamide prepared in analogy to example 1 of U.S. Pat. No. 5,077,378. A dielectric constant of 3.1 is measured in the frequency range from 100 Hz to 1 MHz.

EXAMPLE 29

Filling of Narrow Trenches

Figure 3:
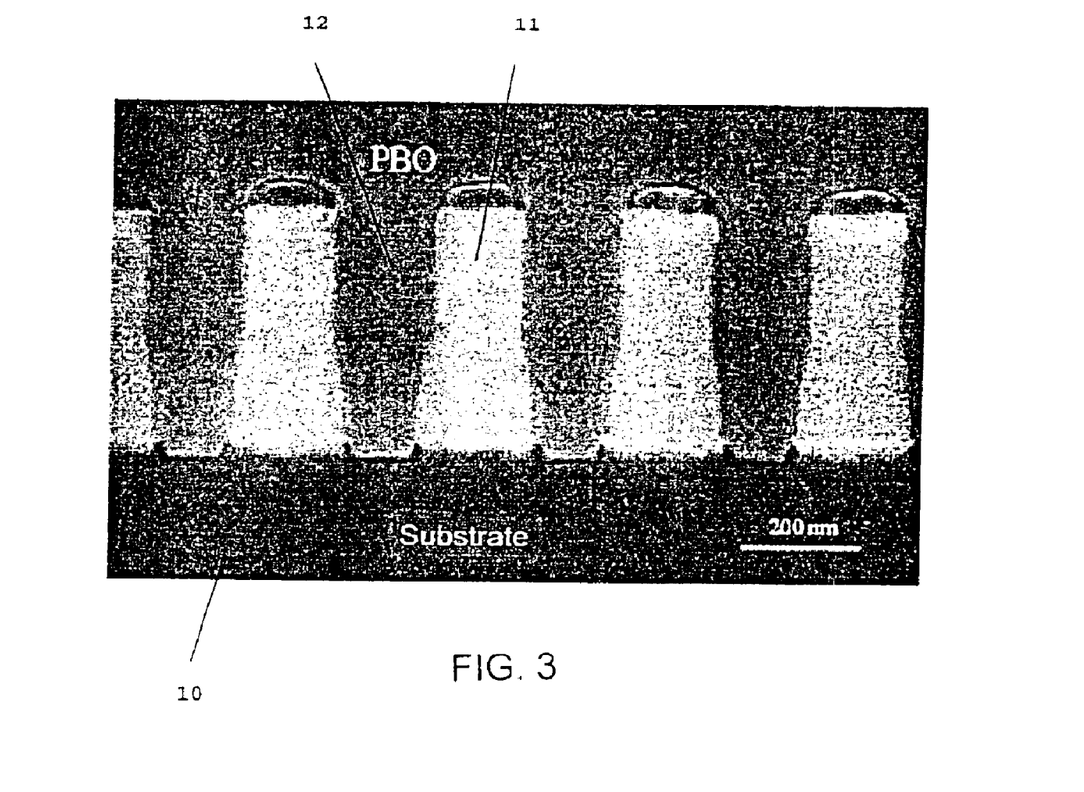
FIG. 3 shows a scanning electron micrograph of Al conductor tracks whose interstices have been filled with a polyhydroxyamide according the invention.

The polyhydroxyamide 1 is dissolved in NMP (20% by weight solution) and the solution is subjected to pressure filtration via a membrane having 0.2 μm pores. This solution is applied by spin coating to a substrate on which there are already metallic structures present. Following application of the solution, the layer is dried on a hotplate at 100° C., at 140° C., and at 200° C. for 2 minutes each and is then heat-treated at 400° C. for 1 hour under nitrogen. The metal structures, some of which have an aspect ratio of more than 4, with the distance between the structures being in some cases only 120 nm, are electrically insulated from one another in this operation. The PBO material fills the trenches without defects. A scanning electron micrograph of a section perpendicular to the conductor tracks is depicted in FIG. 3. On the substrate 10 there are metallic structures 11. The trenches 12 between the metal structures 11 are completely filled down to their base with the dielectric.

EXAMPLE 30

Filling of Narrow Trenches 2

Example 29 is repeated but using polyhydroxyamide 7 instead of polyhydroxyamide 1. Here again, the trenches are filled without defects.

EXAMPLE 31

Filling of Narrow Trenches 3

Example 29 is repeated but using polyhydroxyamide 9 instead of polyhydroxyamide 1. Here again, the trenches are filled without defects.

EXAMPLE 32

Dual Damascene Structure

Figure 4:
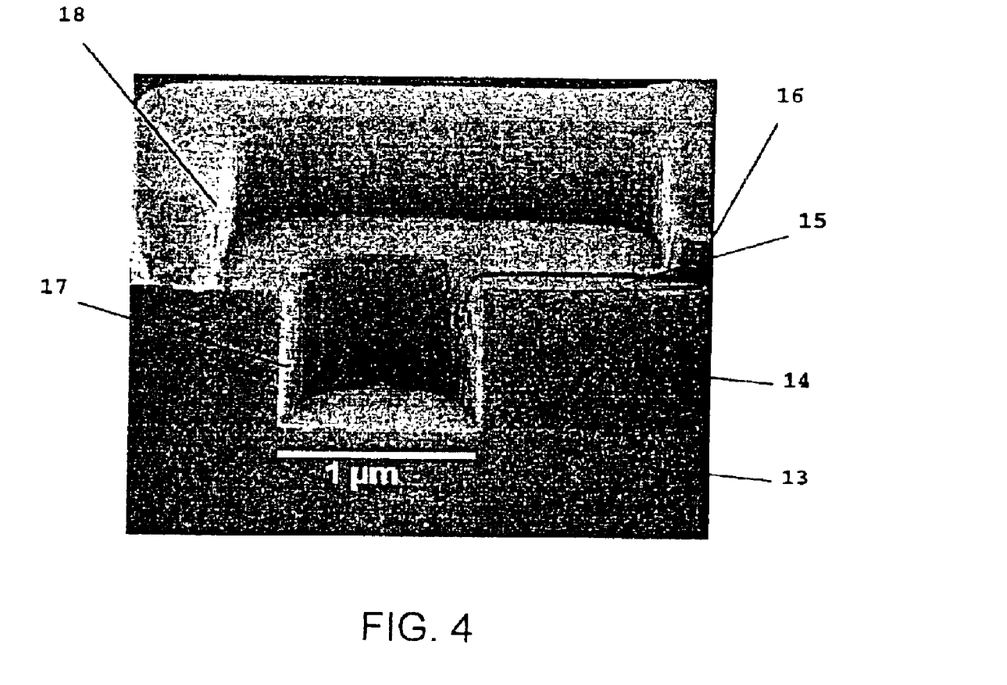
FIG. 4 shows a scanning electron micrograph of a dual damascene structure.

The structure produced in this example is shown in FIG. 4. Polyhydroxyamide 4 is dissolved in γ-butyro-lactone (20% strength solution) and the solution is subjected to pressure filtration via a membrane having 0.2 μm pores. The solution is applied to a silicon substrate 13 by spin coating at 2500 rpm for 25 seconds and the layer is dried on a hotplate at 100° C. for 2 minutes and then at 140° C. for 2 minutes. The subsequent cure operation, carried out under nitrogen at 400° C. for 1 hour, converts the material into the corresponding polybenzoxazole. Atop this PBO layer 14, which is approximately 700 nm thick, there is then applied a 150 nm silicon oxide layer 15, as a hardmask, using a PECVD unit (Novellus Concept 1). The hardmask is patterned in a standard lithography operation and a plasma etching operation, and the photoresist is removed. A second layer 16 of polyhydroxyamide 4 is applied to the structured hardmask. The 20% strength solution of the material is applied by spin coating at 3000 rpm, dried at 100° C. and at 140° C. for 2 minutes each, and heat-treated at 400° C. for 1 hour. Deposited on the second PBO layer 16 is a silicon dioxide layer, 150 nm thick, as a hardmask. This layer is likewise structured by standard lithography with a subsequent plasma etching operation. The two PBO layers are then structured in an oxygen plasma using the SiO$_2$ masks in an RIE unit (Lam XL). This produces vertical structures with smooth sidewalls in the PBO. A scanning electron micrograph of the structure depicted in FIG. 4. It can be seen that both in the first PBQ layer 14 and in the second PBO layer 16 structures with vertical sidewalls 17, 18 have been produced.

EXAMPLE 33

Example 32 is repeated but using polyhydroxyamide 6 instead of polyhydroxyamide 4. Here again, a defect-free dual damascene structure with smooth, vertical sidewalls is obtained.

EXAMPLE 34

Example 32 is repeated but using polyhydroxyamide 8 instead of polyhydroxyamide 4. Here again, a defect-free dual damascene structure with smooth, vertical sidewalls is obtained.

EXAMPLE 35

Example 32 is repeated but using polyhydroxyamide 10 instead of polyhydroxyamide 4. Here again, a defect-free dual damascene structure with smooth, vertical sidewalls is obtained.

We claim:
1. A polybenzoxazole, comprising a Formula II:

Formula II where

Q' is

Z' is

A' is

X' is $R^1$ is a substituent selected from the group consisting of $R^2$ is a substituent selected from the group consisting of a hydrogen atom, a trifluoromethyl group, an alkyl group having from 1 to 10 carbon atoms, $R^3$ is a substituent selected from the group consisting of an alkyl group having from 1 to 10 carbon atoms and an aryl group having from 5 to 22 carbon atoms;

$R^4$ is a divalent substituent selected from the group consisting of $Y^1$ and $Y^2$ each independently of one another are a radical selected from the group consisting of where if $R^4$ is —$CH_2$—, then x is an integer from 0 to 10; and n is a number between 1 and 100;

m is a number between 1 and 100;

p is a number between 0 and 50;

x is a number between 1 and 10;

y is a number between 1 and 10; and w is a number between 0 and 10, provided that Q' and Z' are not identical.

2. The polybenzoxazole according to claim 1, where $R^1$ is a trifluoromethyl radical.

3. An electronic component, comprising a dielectric including a polybenzoxazole according to claim 1.

4. A dielectric for an electronic component, comprising a polybenzoxzaole according to claim 1.

\* \* \* \* \*